US010410942B2

(12) United States Patent
Chen et al.

(10) Patent No.: US 10,410,942 B2
(45) Date of Patent: Sep. 10, 2019

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventors: Tsan-Hsien Chen, Kaohsiung (TW); Ian Hu, Kaohsiung (TW); Jin-Feng Yang, Kaohsiung (TW); Shih-Wei Chen, Kaohsiung (TW); Hui-Chen Hsu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/823,467

(22) Filed: Nov. 27, 2017

(65) Prior Publication Data
US 2019/0164859 A1    May 30, 2019

(51) Int. Cl.
*H01L 23/34* (2006.01)
*H01L 23/31* (2006.01)
*H01L 23/433* (2006.01)
*H01L 21/56* (2006.01)
*H01L 23/00* (2006.01)
*H01L 23/373* (2006.01)
*H01L 21/48* (2006.01)

(52) U.S. Cl.
CPC ...... *H01L 23/3128* (2013.01); *H01L 21/4814* (2013.01); *H01L 21/565* (2013.01); *H01L 23/373* (2013.01); *H01L 23/4334* (2013.01); *H01L 24/73* (2013.01); *H01L 24/45* (2013.01);
*H01L 24/48* (2013.01); *H01L 2224/1134* (2013.01); *H01L 2224/48091* (2013.01); *H01L 2224/48227* (2013.01); *H01L 2224/73204* (2013.01); *H01L 2224/73265* (2013.01); *H01L 2924/14* (2013.01); *H01L 2924/15311* (2013.01); *H01L 2924/181* (2013.01)

(58) Field of Classification Search
CPC .... H01L 23/373; H01L 23/4334; H01L 23/45
USPC ........................................ 257/707, 713, 720
See application file for complete search history.

(56) References Cited

U.S. PATENT DOCUMENTS 5,552,635 A * 9/1996 Kim ........................ H01L 23/42
257/706
5,825,087 A * 10/1998 Iruvanti .............. H01L 21/4878
257/707

(Continued)

*Primary Examiner* — Nitin Parekh
(74) *Attorney, Agent, or Firm* — Foley & Lardner LLP; Cliff Z. Liu

(57) ABSTRACT

A semiconductor package device includes a substrate, an electronic component, a bonding wire, a heat spreader, a thermal conductive structure and an encapsulant. The electronic component is disposed on the substrate. The bonding wire connects the electronic component to the substrate. The heat spreader is disposed over the electronic component. The thermal conductive structure is disposed between the heat spreader and the electronic component. The thermal conductive structure includes two polymeric layers and a thermal conductive layer. The conductive layer is disposed between the two polymeric layers. The thermal conductive layer has a first end in contact with the electronic component and a second end in contact with the heat spreader. The encapsulant covers the bonding wire.

10 Claims, 6 Drawing Sheets

(56) References Cited

U.S. PATENT DOCUMENTS

| | | | | |
|---|---|---|---|---|
| 5,977,626 | A | * | 11/1999 | Wang .................. H01L 23/3128 257/691 |
| 6,114,761 | A | * | 9/2000 | Mertol .................. H01L 23/367 257/722 |
| 6,191,492 | B1 | * | 2/2001 | Yamazaki ........... H01L 23/3135 257/787 |
| 6,201,302 | B1 | * | 3/2001 | Tzu .................... H01L 23/3128 257/686 |
| 6,707,166 | B1 | * | 3/2004 | Noguchi ................ H01L 23/24 257/678 |
| 6,933,619 | B2 | * | 8/2005 | Caletka ............... H01L 23/3128 257/707 |
| 7,351,360 | B2 | | 4/2008 | Hougham et al. |
| 7,820,486 | B2 | * | 10/2010 | Ohtani .................... H01L 21/56 257/713 |
| 8,085,531 | B2 | | 12/2011 | Lemak et al. |
| 8,525,326 | B2 | | 9/2013 | Toong et al. |
| 2005/0095875 | A1 | * | 5/2005 | Huang .................. H01L 21/561 438/800 |
| 2006/0112857 | A1 | * | 6/2006 | Hougham .............. B82Y 30/00 106/472 |
| 2007/0040267 | A1 | * | 2/2007 | Zhao ........................ H01L 21/50 257/706 |
| 2007/0114677 | A1 | * | 5/2007 | Kwon .................. H01L 21/4871 257/796 |
| 2009/0136016 | A1 | * | 5/2009 | Gornoi .................... H04L 12/66 379/212.01 |

* cited by examiner

SEMICONDUCTOR DEVICE PACKAGE AND METHOD FOR MANUFACTURING THE SAME

BACKGROUND

1. Technical Field

The present disclosure relates to a semiconductor device package, and to a semiconductor device package including a thermal conductive structure with a higher thermal conductivity in a vertical direction than a thermal conductivity in a lateral direction.

2. Description of the Related Art

The semiconductor industry has seen growth in an integration density of a variety of electronic components in some semiconductor device packages. This increased integration density often corresponds to an increased power density in the semiconductor device packages. As the power density of semiconductor device packages grows, heat dissipation can become desirable, in some implementations. Thus, it can be useful in some implementations to provide a semiconductor device package with improved thermal conductivity.

SUMMARY

In some embodiments, a semiconductor package device includes a substrate, an electronic component, a bonding wire, a heat spreader, a thermal conductive structure and an encapsulant. The electronic component is disposed on the substrate. The bonding wire connects the electronic component to the substrate. The heat spreader is disposed over the electronic component. The thermal conductive structure is disposed between the heat spreader and the electronic component. The thermal conductive structure includes two polymeric layers and a thermal conductive layer. The conductive layer is disposed between the two polymeric layers. The thermal conductive layer has a first end in contact with the electronic component and a second end in contact with the heat spreader. The encapsulant covers the bonding wire.

In some embodiments, a semiconductor package device includes a substrate, an electronic component, a bonding wire, a thermal conductive structure, a heat spreader and an encapsulant. The electronic component is disposed on the substrate. The bonding wire connects the electronic component to the substrate. The thermal conductive structure is disposed on the electronic component. The heat spreader is disposed on the thermal conductive structure and in contact with the thermal conductive structure. The encapsulant covers the bonding wire and is physically spaced apart from the heat spreader.

In some embodiments, a method of manufacturing a semiconductor package device includes providing a substrate; disposing an electronic component on the substrate; forming a conductive wire to electrically connect the electronic component to the substrate; forming an encapsulant covering the conductive wire to surround the electronic component and to expose a portion of the electronic component; disposing a thermal conductive structure on the portion of the electronic component that is exposed from the encapsulant; and disposing a heat spreader on the thermal conductive structure and in contact with the thermal conductive structure.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
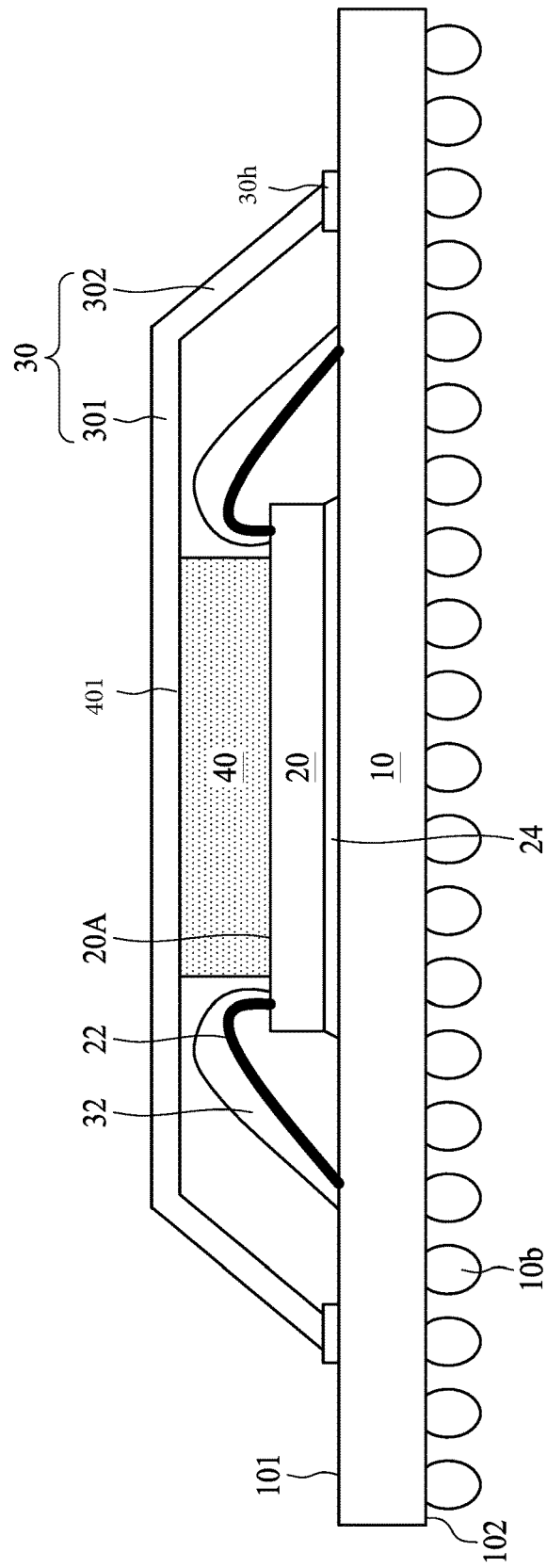
FIG. 1 is a cross-sectional view of some embodiments of a semiconductor device package in accordance with a first aspect of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

The following description includes description of some semiconductor device packages, and methods of manufacturing thereof. In some embodiments, a semiconductor device package includes a thermal conductive structure including a polymeric layer and vertically-aligned fillers. The vertically-aligned fillers help to make a thermal conductivity of the thermal conductive structure in a vertical direction greater than a thermal conductivity of the thermal conductive structure in one or more lateral directions. This can provide for heat generated by a semiconductor component during operation to be transferred to a heat spreader quickly and/or efficiently via a short thermal path, as discussed below. The polymeric layer can help to improve contact between a thermal conductive structure and the semiconductor component. In some embodiments, the thermal conductive structure has a first thickness in a central region, and a second thickness in an edge region, and the first thickness is smaller than the second thickness.

FIG. 1 is a cross-sectional view of some embodiments of a semiconductor device package 1 in accordance with a first aspect of the present disclosure. As shown in FIG. 1, the semiconductor device package 1 includes a package substrate 10, one or more semiconductor components 20, a heat spreader 30 and a thermal conductive structure 40.

The package substrate 10 has a surface 101 (e.g., an upper surface) and a surface 102 (e.g., a bottom surface) opposite to the surface 101. In some embodiments, the package substrate 10 may include a semiconductor substrate, an interposer or other suitable substrate (e.g. a substrate that includes a circuit, one or more conductive layers and/or conductive structures integrated therein). In one or more embodiments, the surface 101 is configured to receive the semiconductor component 20. The surface 102 may be configured to provide for an electrical connection external to the semiconductor component 20. For example, the surface 102 may expose conductive pads on which one or more solder balls 10b or other electrical connectors can be formed or disposed.

The semiconductor component (or electronic component) 20 is disposed over the surface 101 of the package substrate 10. In some embodiments, the semiconductor component 20 may be electrically connected to the surface 102 through a circuit, conductive layer or conductive structures embedded in the package substrate 10, which can provide for electrically connecting the semiconductor device package 1 to another electronic device such as a circuit board. In some embodiments, the semiconductor component 20 includes one or more semiconductor dies, or the like. The semiconductor component 20 can be disposed on the package substrate 10 via, for example, a die attaching layer 24 (e.g. a die attaching film, and/or an adhesive, such as electrically and/or thermally conductive adhesive).

The heat spreader 30 is disposed over the surface 101 of the package substrate 10 and the semiconductor component 20. In some embodiments, a material of the heat spreader 30 (that is, a material included in the heat spreader 30) may include, but is not limited to, a metal (e.g. copper or aluminum), a metal alloy, or another material with high thermal conductivity. In some embodiments, the thermal conductive structure 40 is interposed between and in contact with the semiconductor component 20 and the heat spreader 30, and can transfer heat generated by the semiconductor component 20 to the heat spreader 30. In some embodiments, an area of the thermal conductive structure 40 (e.g. an area of a top surface of the thermal conductive structure 40, or of a footprint of the thermal conductive structure 40) is equal to or larger than about 90% of an area of the semiconductor component 20 (e.g. an area of a top surface of the semiconductor component 20, or of a footprint of the semiconductor component 20), such as at least about 92% of the area the semiconductor component 20, at least about 94% of the area the semiconductor component 20, at least about 96% of the area the semiconductor component 20, at least about 98% of the area the semiconductor component, about 100% of the area the semiconductor component 20, or any value in a range of about 90% of the area the semiconductor component 20 to about 100% of the area the semiconductor component 20. This can help to improve heat dissipation efficiency.

In some embodiments, the semiconductor component 20 has an active surface 20A having input/output (I/O) terminals such as bonding pads or other conductive structures configured to electrically connect the semiconductor component 20 to the package substrate 10. In some embodiments, the active surface 20A of the semiconductor component 20 may face the heat spreader 30. In some embodiments, the semiconductor device package 1 may further include conductive wires 22 such as bonding wires electrically connecting the active surface 20A to the package substrate 10.

The heat spreader 30 may substantially surround or cover the semiconductor component 20, the conductive wires 22 and the thermal conductive structure 40. In some embodiments, the heat spreader 30 may include a first portion 301 and a second portion 302 connected to each other. The first portion 301 may be substantially disposed on and in contact with an upper surface 401 of the thermal conductive structure 40. In some embodiments, the first portion 301 may extend laterally across the upper surface 401 of the thermal conductive structure 40, and may be wider in a lateral direction than the thermal conductive structure 40. The second portion 302 is connected to the first portion 301, and may extend from the first portion 301 toward the package substrate 10. In some embodiments, the second portion 302 is extended in an oblique direction with respect to the surface 101 of the package substrate 10 and may be connected to the package substrate 10 (e.g. may extend in a substantially straight oblique line that connects the first portion 301 and the surface 101 of the package substrate 10). In some embodiments, the second portion 302 of the heat spreader 30 may be adhered to and in contact (e.g. in direct contact) with the surface 101. In some embodiments, the second portion 302 of the heat spreader 30 may be connected to the surface 101 through an adhesive layer 30h.

In some embodiments, the semiconductor device package 1 may further include an encapsulant 32 covering or encapsulating the conductive wires 22 and a portion of the active surface 20A of the semiconductor component 20. In some embodiment, the encapsulant 32 exposes a portion of the active surface 20A of the semiconductor component 20 and the thermal conductive structure 40. For example, the thermal conductive structure 40 is disposed on the portion of the active surface 20A of the semiconductor component 20 that is exposed from the encapsulant 32. For example, the encapsulant 32 is physically spaced apart from lateral surfaces of the thermal conductive structure 40. For example, there is a gap between the encapsulant 32 and the lateral surfaces of the thermal conductive structure 40. For example, a top portion of the encapsulant 32 is lower than the upper surface 401 of the thermal conductive structure 40. In some embodiments, the encapsulant 32 exposes the heat spreader 30. For example, the encapsulant 32 is physically spaced apart from the heat spreader 30. For example, there is a gap between the top portion of the encapsulant 32 and the heat spreader 30. In some embodiments, a material of the encapsulant 32 may include a molding compound such as an epoxy resin or the like. In some embodiments, the encapsulant 32 may be an underfill without fillers therein. In some embodiments, the encapsulant 32 may include fillers each with a diameter less than about one-third of a pitch of the conductive wires 22, or the distance between any two of the conductive wires 22 (e.g. less than about 30% of the pitch or the distance between any two of the conductive wires, less than about 27% of the pitch or the distance between any two of the conductive wires, or less than about 24% of the pitch or the distance between any two of the conductive wires). In some embodiments, the encapsulant 32 may be formed by a dispensing technique. A coefficient of thermal conductivity of the encapsulant 32 is lower than a coefficient of thermal conductivity of the thermal conductive structure 40 (e.g. the thermal conductive structure 40 has a coefficient of thermal conductivity that is about 1.1 or more times that of the encapsulant 32, about 1.2 or more times that of the encapsulant 32, about 1.3 or more times that of the encapsulant 32, or greater). In some embodiments, the coefficient of thermal conductivity of the encapsulant 32 is in a range of about 0.7 watts per meter-Kelvin (W/mK) to about 6 W/mK.

In some comparative implementations, the encapsulant 32 can be replaced by a molding compound with relatively larger fillers (e.g., having a diameter greater than about half of the pitch of the conductive wires 22) to cover the thermal conductive structure 40 and/or the heat spreader 30. However, during a process for forming the molding component with relatively larger fillers, the molding compound may crush or damage the conductive wires. In some embodiments, the relatively larger fillers of the molding compound may cause an undesired short circuit between the conductive wires, rendering the semiconductor component malfunctioned. Furthermore, a coefficient of thermal expansion (CTE) of the molding compound is in a range of about 4 parts per million per degree Celsius (ppm/° C.) to about 40 ppm/° C. while the CTE of the thermal conductive structure 40 can be, according to some embodiments, greater than about 100 ppm/° C. (e.g., in a range of about 200 ppm/° C. to about 300 ppm/° C.). Due to a CTE mismatch between the encapsulant and the thermal conductive structure, a delamination or warpage risk may be incurred.

As shown in FIG. 1, the encapsulant 32 (or underfill) without fillers or including relatively smaller fillers is dispensed to cover the conductive wires 22 and to expose the thermal conductive structure 40, which can prevent the conductive wires 22 from being crushed or avoids a short circuit between the conductive wires 22. In addition, because the thermal conductive structure 40 is exposed from the encapsulant 32, the delamination or warpage risk can be reduced.

A thermal conductivity of the thermal conductive structure 40 in a vertical direction Z substantially perpendicular to the surface 101 of the package substrate 10 is greater than (e.g. by a factor of about 1.1 or more, 1.2 or more, 1.3 or more, or greater) the thermal conductivity of the thermal conductive structure 40 in one, or both, lateral directions X, Y, which are substantially parallel to the surface 101 of the package substrate 10 (e.g. the surface 101 of the package substrate 10 may be substantially in a plane that extends in the X and Y directions). Accordingly, heat generated by the semiconductor component 20 during operation can be quickly and/or efficiently transferred through the thermal conductive structure 40 in a vertical direction towards the heat spreader 30, thus improving heat dissipation efficiency. The thermal conductive structure 40 can provide for a short thermal path, as discussed below. In some embodiments, the thermal conductive structure 40 is configured to have a high coefficient of thermal conductivity and configured to be adhered to the semiconductor component 20 and to the heat spreader 30. In some embodiments, a thickness of the thermal conductive structure 40 may be greater than about 200 micrometers. By way of example, the thickness of the thermal conductive structure 40 may be in a range of about 200 micrometers to about 700 micrometers; in a range of about 200 micrometers to about 600 micrometers; in a range of about 300 micrometers to about 600 micrometers; in a range of about 300 micrometers to about 500 micrometers; or within other suitable ranges. In some embodiments, the coefficient of thermal conductivity of the thermal conductive structure 40 may be in a range of about 40 W/mK to about 90 W/mK. In some embodiments, the thermal conductive structure 40 is in direct contact with the semiconductor component 20 and the heat spreader 30 without using intervening materials such as a die attaching material or a molding compound, which can have a lower coefficient of thermal conductivity than does the thermal conductive structure 40. This can help to make an average coefficient of thermal conductivity in a thermal pathway between the semiconductor component 20 and the heat spreader 30 high, and thus enhance an efficiency of the thermal conductivity of the semiconductor package device 1.

Figure 2A:
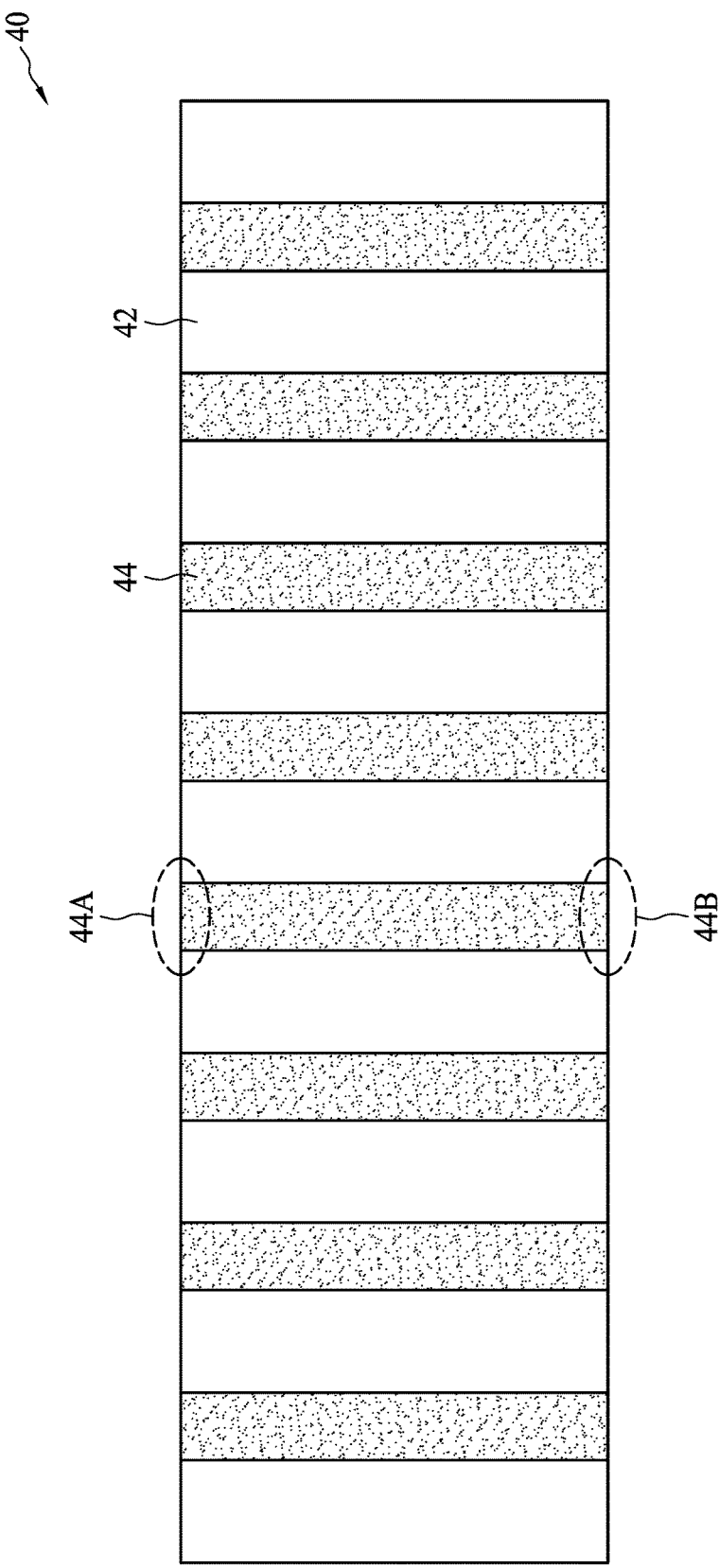
FIG. 2A is a cross-sectional view of some embodiments of a thermal conductive structure in an initial state in accordance with some embodiments of the present disclosure.

FIG. 2A is a cross-sectional view of some embodiments of a thermal conductive structure 40 in an initial state in accordance with some embodiments of the present disclosure. As shown in FIG. 1 and FIG. 2A, the thermal conductive structure 40 may include a plurality of polymeric layers 42 and fillers 44 (which may serve as a thermal conductive layer) aligned in a substantially vertical manner disposed between the polymeric layers 42. In some embodiments, a material of the polymeric layers 42 may include, but is not limited to, a silicone resin or the like. In some embodiments, a material of the polymeric layers 42 may be optically and/or thermally sensitive, and may be optically and/or thermally cured. In some embodiments, the polymeric layers 42 may be cured before the heat spreader 30 is formed. In some embodiments, a material of the fillers 44 may include, but is not limited to, graphite, graphene, a carbon fiber, a boron nitride or the like. In some embodiments, each of the fillers 44 is laterally surrounded or covered by the polymeric layers 42, such that the fillers 44 are substantially held in a vertical alignment by the polymeric layers 42. A sidewall of the fillers 44 can be laterally surrounded by the polymeric layers 42. An end 44A and an end 44B (e.g. opposing vertical ends) of each of the fillers 44 are exposed from the polymeric layers 42. One or both of the end 44A and end 44B can have a higher coefficient of thermal conductivity than a coefficient of thermal conductivity of the sidewall of the filler 44 (e.g. at an interface between the fillers 44 and the polymeric layer 42), such as a coefficient of thermal conductivity that is about 1.1 or more times that of the sidewall, about 1.2 or more times that of the sidewall, about 1.3 or more times that of the sidewall, or greater. The vertically-aligned fillers 44 can have a high coefficient of thermal conductivity, and can provide heat transfer channels in the vertical direction Z. In contrast to non-vertically-aligned fillers (e.g. randomly dispersed fillers), the vertically-aligned fillers 44 help to make the thermal conductivity of the thermal conductive structure 40 in the vertical direction Z substantially greater than that in the lateral directions X, Y, and thus heat generated by the semiconductor component 20 during operation can be quickly and/or efficiently transferred to the heat spreader 30 via a short thermal path (e.g. a direct path along a vertically-aligned filler 44). The polymeric layer 42s can include a soft and flexible material, which can help to improve contact between the thermal conductive structure 40 and the semiconductor component 20, and can help to avoid delamination. The material of the thermal conductive structure 40 can be chemically stable, and thus can avoid chemical crosscontamination between the thermal conductive structure 40 and the semiconductor component 20.

Figure 2B:
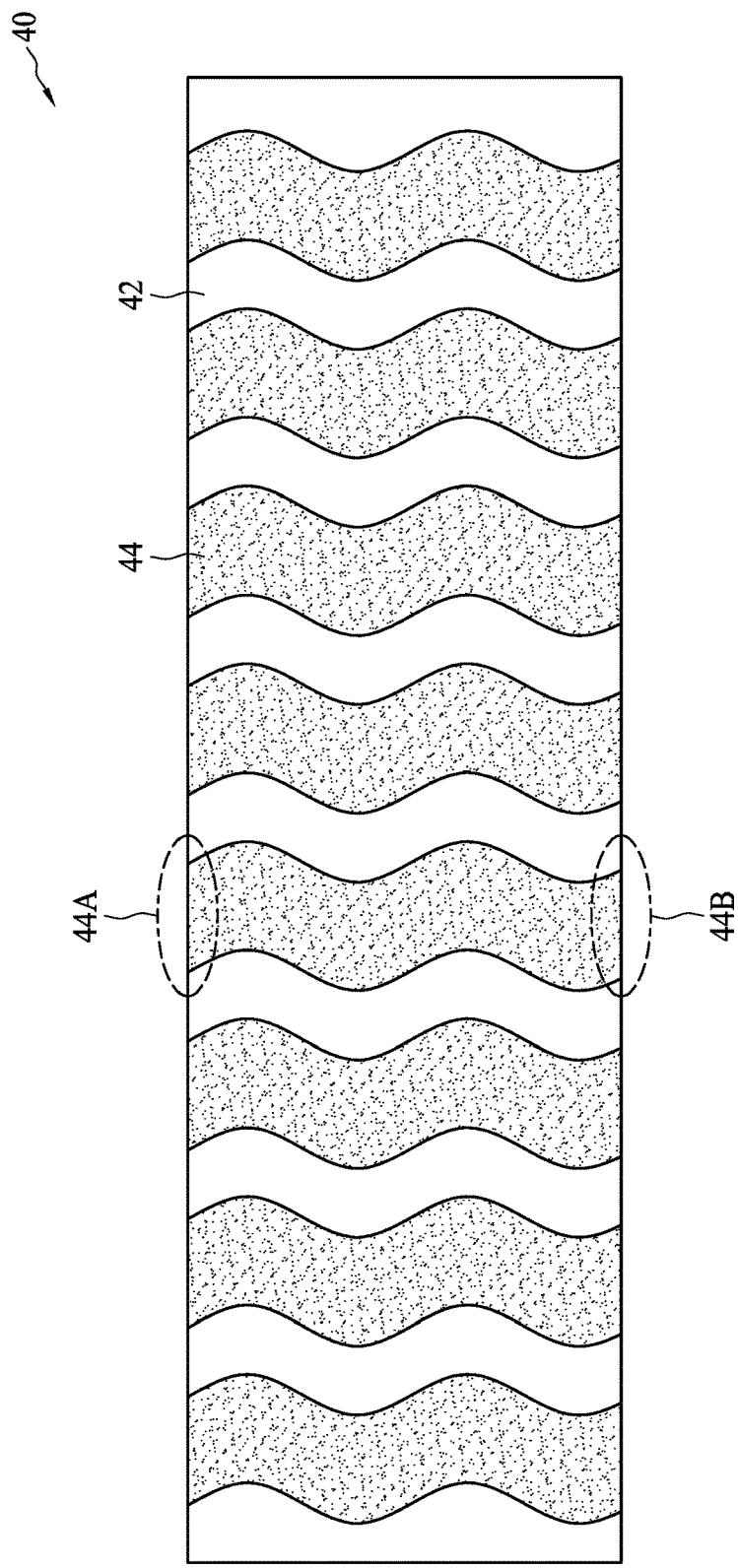
FIG. 2B is a cross-sectional view of a thermal conductive structure in a deformed state in accordance with some embodiments of the present disclosure.

FIG. 2B is a cross-sectional view of some embodiments of a thermal conductive structure 40 in a deformed state in accordance with some embodiments of the present disclosure. In some embodiments, the thermal conductive structure 40 is suitable for implementations in which an external force is applied (e.g., by a mold chase or the like) to clamp the thermal conductive structure 40 to the semiconductor component 20. In some such embodiments, a die attaching layer (e.g. a die attaching film) may be omitted. In some implementations, the thermal conductive structure 40 is compressed and connected to the heat spreader 30 and the semiconductor component 20 by the external force. By omitting the die attaching film, which can have a low coefficient of thermal conductivity, the thermal conductive structure 40 can enhance heat dissipation efficiency for the semiconductor device package 1. In some embodiments, the thermal conductive structure 40 may be cured before the heat spreader 30 is formed. As shown in FIG. 2B, after the thermal conductive structure 40 is compressed, the fillers 44 of the thermal conductive structure 40 can still be substantially aligned vertically (e.g. despite some deviation from perfect vertical alignment) and can provide heat transfer channels in substantially the vertical direction Z. In some embodiments, a thickness of the thermal conductive structure 40 after such deformation may be reduced by an amount in a range of about 10% to about 40% of an initial thickness (e.g., by about 10%, by about 20%, by about 30%, or by about 40%). Such a change in thickness may be within a tolerance of the thermal conductive structure 40. By way of example, when the initial thickness of the thermal conductive structure 40 is about 500 micrometers, the thickness of the thermal conductive structure 40 after deformation may be about 400 micrometers and within the tolerance of the thermal conductive structure 40. In addition, contact between the thermal conductive structure 40 and the semiconductor component 20 may be improved after the thermal conductive structure 40 is compressed. In some embodiments, the compression of the thermal conductive structure 40 may increase a tolerance of thickness deviation (e.g. for a manufacturing process) of the thermal conductive structure 40, and can improve a thickness uniformity of the thermal conductive structure 40. By way of example, if a deformation ratio (e.g. a stretch ratio or extension ratio) is 20%, and the initial thickness of the thermal conductive structure 40 is 120 micrometers, a thickness deviation tolerance for the thermal conductive structure 40 is 24 micrometers (20% of 120 micrometers). Similarly, if the deformation ratio is 20%, and the initial thickness of the thermal conductive structure 40 is 500 micrometers, a thickness deviation tolerance for the thermal conductive structure 40 is 100 micrometers (20% of 500 micrometers).

Semiconductor device packages provided for by the present disclosure are not limited to the above-described embodiments, and may include other, different embodiments, such as those described below. To simplify the description and for convenient comparison between each of the embodiments of the present disclosure, the same or similar components in each of the following embodiments are marked with the same numerals and are not redundantly described.

Figure 3:
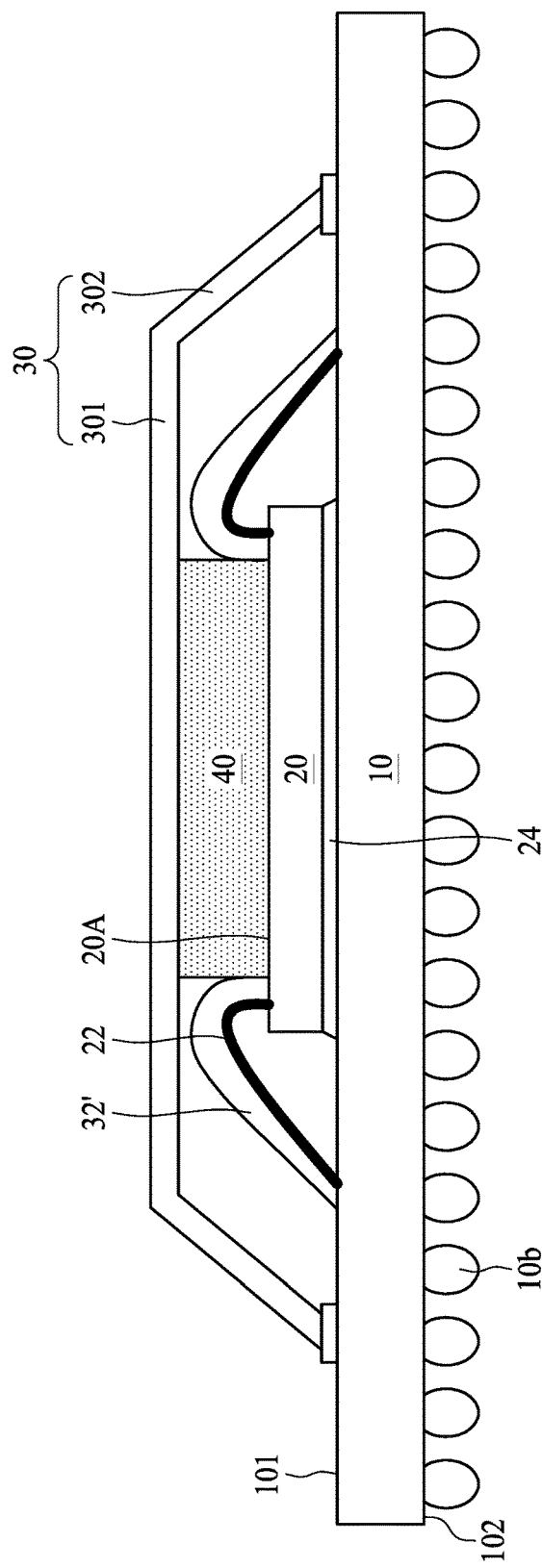
FIG. 3 is a cross-sectional view of some embodiments of a semiconductor device package in accordance with a second aspect of the present disclosure.

FIG. 3 is a cross-sectional view of some embodiments of a semiconductor device package 3 in accordance with a second aspect of the present disclosure. The semiconductor device package 3 is similar to the semiconductor device package 1 in FIG. 1 except that the encapsulant 32' of the semiconductor device package 3 is in contact with at least a first portion of the lateral surface of the thermal conductive structure 40 due to bleeding of the encapsulant 32' (e.g. during a thermal process). A second portion of the lateral surface of the thermal conductive structure may be exposed from the encapsulant 32'. In some embodiments, a portion of the encapsulant 32' may be disposed between the thermal conductive structure 40 and the semiconductor component 20.

Figure 4:
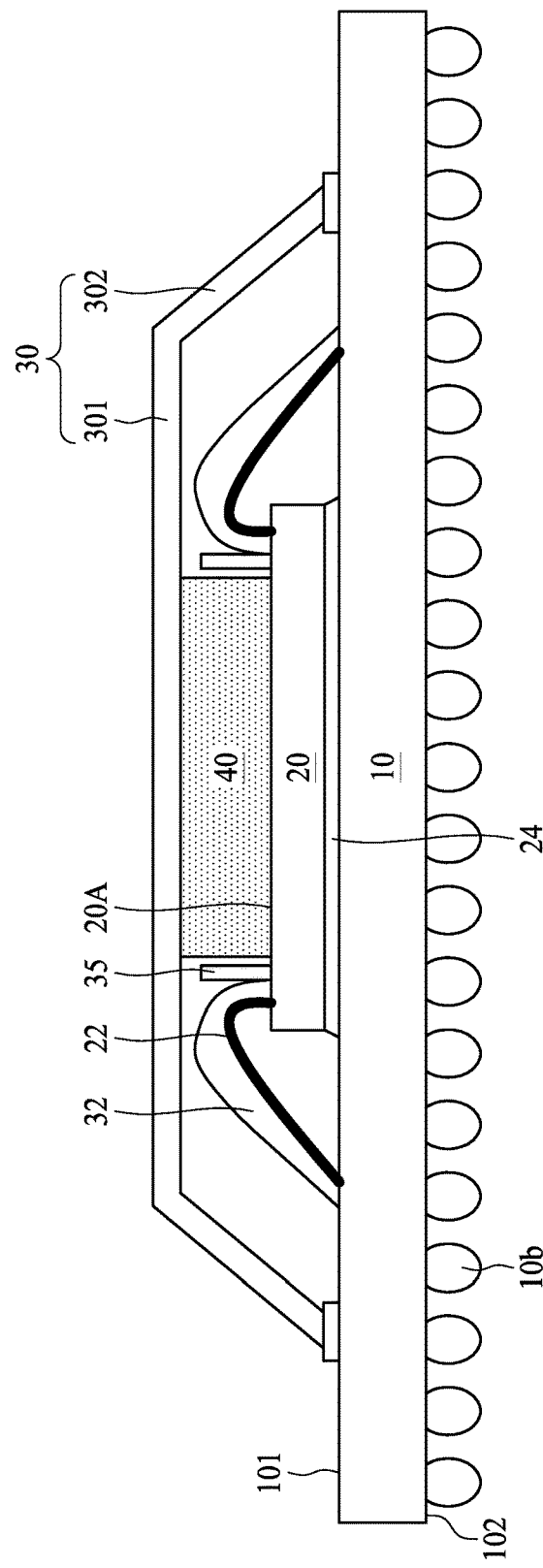
FIG. 4 is a cross-sectional view of some embodiments of a semiconductor device package in accordance with a third aspect of the present disclosure.

FIG. 4 is a cross-sectional view of some embodiments of a semiconductor device package 4 in accordance with a third aspect of the present disclosure. The semiconductor device package 4 is similar to the semiconductor device package 1 in FIG. 1 except that the semiconductor device package 4 further includes a barrier element 35. The barrier element 35 is disposed on the upper surface 20A of the semiconductor component 20 and surrounds a portion of the upper surface 20A of the semiconductor component 20 on which the thermal conductive structure 40 is disposed. The barrier element 35 is used to prevent the encapsulant 32 from bleeding to contact the thermal conductive structure 40.

Figure 5:
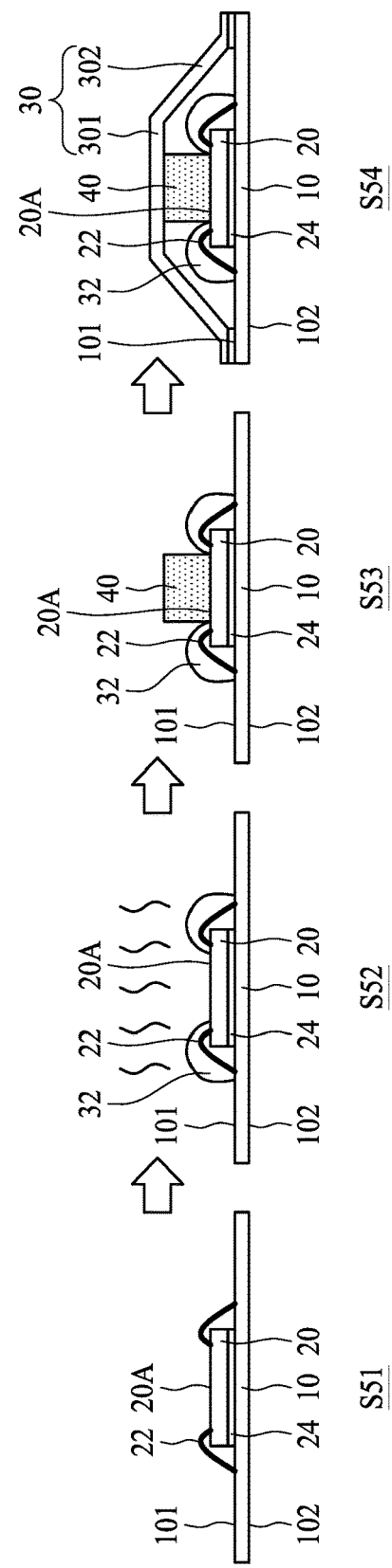
FIG. 5 illustrates cross-sectional views of a semiconductor device package at various stages of fabrication, in accordance with some embodiments of the present disclosure.

FIG. 5 illustrates cross-sectional views of a semiconductor device package at various stages of fabrication, in accordance with some embodiments of the present disclosure. Various figures have been simplified to better show aspects of the present disclosure.

Referring to S51, a semiconductor substrate 10 is provided and a semiconductor component 20 is attached to a surface 101 of the semiconductor substrate 10 through, for example, a die attaching layer 24 (e.g. a die attaching film, and/or an adhesive, such as a conductive adhesive). An active surface 20A of the semiconductor component 20 is electrically connected to the surface 101 of the semiconductor substrate 10 through conductive wires 22 (e.g., bonding wires).

Referring to S52, an insulating material (e.g., an epoxy without fillers or with relatively small fillers) is formed on a portion of the surface 101 of the semiconductor substrate 10 and a portion of the active surface 20A of the semiconductor component 20 to cover or encapsulate the conductive wires 22. In some embodiments, the insulating material can be formed by, for example, a dispensing or spraying technique. A reflow process is then carried out to form an encapsulant 32 by, for example, an oven curing technique.

Referring to S53, a thermal conductive structure 40 is disposed on a portion of the active surface 20A of the semiconductor component 20 that is not covered by the encapsulant 32. In some embodiments, the thermal conductive structure 40 is spaced apart from the encapsulant 32. Alternatively, at least a portion of the thermal conductive structure 40 may be in contact with the encapsulant 32 or may be disposed on a portion of the encapsulant 32.

Referring to S54, a heat spreader 30 is attached to the surface 101 of the semiconductor substrate 10 to cover the semiconductor component 20, the conductive wires 22, the encapsulant 32 and the thermal conductive structure 40. The heat spreader 30 is in contact with an upper surface of the thermal conductive structure 40. In some embodiments, electrical contacts (e.g., solder balls) may be disposed on a surface 102 of the semiconductor substrate 10 to form the semiconductor device package 1 as shown in FIG. 1.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package device, comprising:
   a substrate;
   an electronic component disposed on the substrate;
   a bonding wire connecting the electronic component to the substrate;
   a heat spreader disposed over the electronic component; and
   a thermal conductive structure disposed between the heat spreader and the electronic component, the thermal conductive structure comprising:
      two polymeric layers; and
      a thermal conductive layer disposed between the two polymeric layers, the thermal conductive layer having a first end in contact with the electronic component and a second end in contact with the heat spreader; and
   an encapsulant covering the bonding wire.

2. The semiconductor package device of claim 1, wherein the thermal conductive layer has a sidewall surrounded by and in contact with the two polymeric layers, and a thermal conductivity of a surface of the first end in contact with the electronic component or a surface of the second end in contact with the heat spreader is greater than a thermal conductivity of the sidewall.

3. The semiconductor package device of claim 1, wherein the encapsulant exposes a portion of the electronic component and the thermal conductive structure is disposed on the portion of the electronic component that is exposed from the encapsulant.

4. The semiconductor package device of claim 3, wherein the encapsulant is spaced apart from the thermal conductive structure.

5. The semiconductor package device of claim 3, wherein a portion of the encapsulant is in contact with the thermal conductive structure.

6. The semiconductor package device of claim 1, wherein the electronic component has an active surface facing toward the thermal conductive structure.

7. The semiconductor package device of claim 1, wherein the encapsulant is spaced apart from the heat spreader.

8. The semiconductor package device of claim 1, wherein the thermal conductive layer includes graphene.

9. The semiconductor package device of claim 1, wherein the polymeric layers include a silicone material.

10. The semiconductor package device of claim 1, wherein the encapsulant includes an epoxy.

* * * * *